United States Patent
Ishihara et al.

(10) Patent No.: US 7,501,808 B2
(45) Date of Patent: Mar. 10, 2009

(54) CURRENT SENSING DEVICE

(75) Inventors: Masato Ishihara, Anjo (JP); Seiichirou Ootake, Hazu-gun (JP); Takeshi Tsukamoto, Okazaki (JP); Toru Iwasa, Fukaya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 11/826,069

(22) Filed: Jul. 12, 2007

(65) Prior Publication Data

US 2008/0030190 A1    Feb. 7, 2008

(30) Foreign Application Priority Data

Aug. 3, 2006    (JP)    ............... 2006-212325

(51) Int. Cl.
*G01R 15/18*    (2006.01)
*G01R 33/00*    (2006.01)

(52) U.S. Cl. ............... 324/117 R; 324/117 H; 324/158.1

(58) Field of Classification Search ... 324/117 R–117 H
See application file for complete search history.

(56) References Cited

U.S. PATENT DOCUMENTS 5,523,677 A * 6/1996 Kawakami et al. ...... 324/117 R
6,411,078 B1 * 6/2002 Nakagawa et al. ...... 324/117 H
6,545,456 B1 * 4/2003 Radosevich et al. ..... 324/117 H
7,148,675 B2 * 12/2006 Itoh ....................... 324/117 R
2006/0033487 A1 * 2/2006 Nagano et al. .......... 324/117 H
2008/0054881 A1 * 3/2008 Kim ...................... 324/117 R

FOREIGN PATENT DOCUMENTS

| JP | A-5-72233 | 3/1993 |
| JP | A-08-094728 | 4/1996 |
| JP | A-2004-257953 | 9/2004 |

* cited by examiner

*Primary Examiner*—Ha Tran T Nguyen
*Assistant Examiner*—Emily Y Chan
(74) *Attorney, Agent, or Firm*—Posz Law Group, PLC

(57) ABSTRACT

A magnetic core is shaped in a ring having a gap and disposed to surround a conductive wire. When an electric current flows in the conductive wire, a magnetic field is generated in the gap. A sensor package includes a Hall element and a lead frame, which are embedded in a resin mold. The sensor package is disposed in the gap to produce an output signal corresponding to the magnetic field in the gap. The Hall element is positioned in the center of the gap, that is, at the position which is the same distance from the end surfaces of the magnetic core.

8 Claims, 6 Drawing Sheets

US 7,501,808 B2

CURRENT SENSING DEVICE

CROSS REFERENCE TO RELATED APPLICATION

This application is based on and incorporates herein by reference Japanese Patent Application No. 2006-212325 filed on Aug. 3, 2006.

FIELD OF THE INVENTION

The present invention relates to a current sensing device.

BACKGROUND OF THE INVENTION

In a conventional current sensing device disclosed in, for instance, JP 5-72233A, as shown in FIGS. 10A and 10B, a ring-shaped magnetic core 100 has a gap 100a and is provided to surround a conductive wire 105. When an electric current If flows in the conductive wire 105, a magnetic flux $\phi$ flows in the magnetic core 100 and a magnetic field H is formed in the gap 100a. The magnitude of the magnetic field H varies with the magnitude of the current If. A sensor package 110 including a sensor chip 111 such as a magnetism-responsive Hall element, which is mounted on a lead frame 113 and embedded in a resin mold 112, is disposed in the gap 100a. The sensor chip 111 produces an output signal having a magnitude corresponding to the magnitude of the magnetic field H. For easy installation, the center of the sensor package 110, specifically the lead frame 113 of the sensor package 110, is positioned on the center of the gap 100a of the magnetic core 100, that is, at the same distance D from the ends of the magnetic core 100 facing each other and defining the gap 100a. As a result, the sensor chip 111, particularly the Hall element (shown by dotted line), is offset from the center of the gap 100a. The sensor chip 111 is susceptible to external magnetic field other than the magnetic field generated by the current If, and the output signal includes errors.

SUMMARY OF THE INVENTION

It is therefore an object of the present invention to provide a current sensing device, which is less susceptible to external magnetic field.

According to the present invention, an improved current sensing device is provided for sensing a current flowing in a conductive wire. The current sensing device comprises a magnetic core and a sensor package. The magnetic core has a gap between end surfaces thereof and is disposed to surround the conductive wire so that a magnetic field is generated in the gap in accordance with a current flowing in the conductive wire. The sensor package includes a magnetism sensing element and is disposed in the gap to produce an output signal corresponding to the magnetic field in the gap. The magnetism sensing element is disposed in a center of the gap, which is a same distance from the end surfaces of the magnetic core.

This arrangement is based on a finding in the analysis of magnetic flux in a gap of a magnetic core caused by an external magnetic field. It is found specifically that the magnetic flux of the external magnetic field do not enter a magnetism-responsive sensor chip, when the external magnetic field is applied in the direction parallel to opposing faces of the magnetic core 100, which forms the gap, that is, in the direction a in FIG. 10B.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENT

First Embodiment

Figure 1:
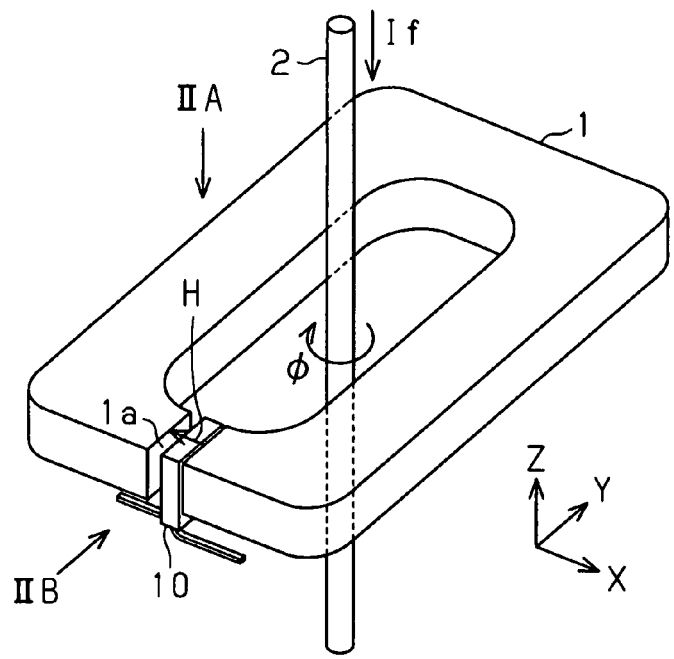
FIG. 1 is a perspective view of a current sensing device according to a first embodiment of the present invention.

Referring first to FIG. 1, a current sensing device has a magnetic core 1 and a sensor package 10. The magnetic core 1 is a ring-shaped plate having a gap 1a. The magnetic core 1 surrounds a conductor wire 2. When an electric current If flows in the wire 2, magnetic flux $\phi$ flow in the core 1 and generate a magnetic field H in the gap 1a. The magnitude of the magnetic field H varies in correspondence to the magnitude of the current If. The sensor package 10 is disposed in the gap 1a to produce an output signal, which varies with the magnitude of the magnetic field H in the gap 1a.

Figure 2A:
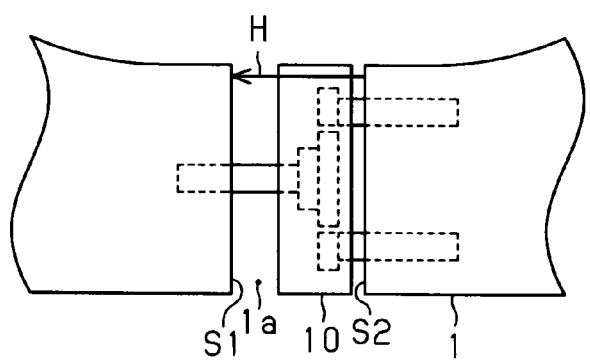
FIGS. 2A and 2B are a plan view and a side view of the current sensing device viewed in directions IIA and IIB in FIG. 1.
Figure 2B:
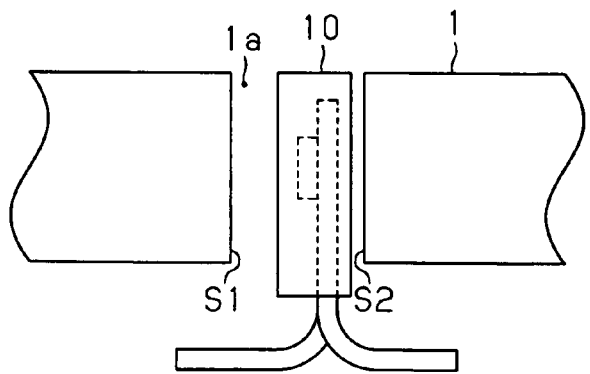
Figure 3:
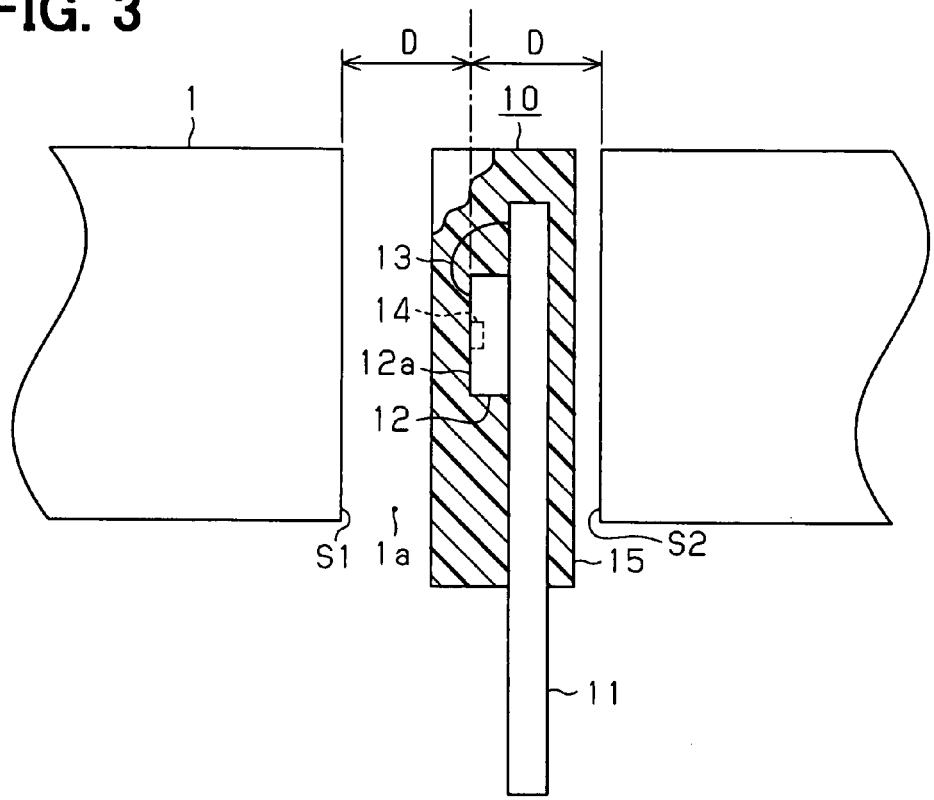
FIG. 3 is a sectional side view of the current sensing device according to the first embodiment.

As shown in FIGS. 2A, 2B and 3, the sensor package 10 has a lead frame 11, a semiconductor sensor chip 12, wires 13 and a package case made of a resin mold 15. The semiconductor sensor chip 12 is a Hall IC, which includes a magnetism-responsive Hall element 14 (shown by dotted line) and a signal processing circuits such as an amplifier circuit. The sensor chip 12 is mounted on the lead frame 11 and electrically connected to the lead frame 11 by the wires 13. These components 11, 12, 13 are molded in the resin mold 15. As known well, the sensor chip 12 produces a Hall voltage, which varies with the magnitude of the magnetic field H generated in the gap 1a. This voltage is amplified by the amplifier circuit and produced from the lead frame 11 to an external circuit.

The Hall element 14 is formed on a top surface of the sensor chip 12. This surface is defined as a Hall element forming surface 12a in FIG. 3. The sensor package 10 is disposed in the gap 1a in such a manner that the Hall element 14 of the sensor chip 12, specifically the Hall element forming surface 12a, is parallel to both end surfaces S1 and S2 of the magnetic core 1, which face each other, and positioned at the center of the gap 1a with the same distance D from the end surfaces S1 and S2. This arrangement is less susceptible to external magnetic fields for the following reasons.

For the analysis of influence of external magnetic fields, three orthogonal axes X, Y, Z are denoted as shown in FIG. 1.

Figure 4:
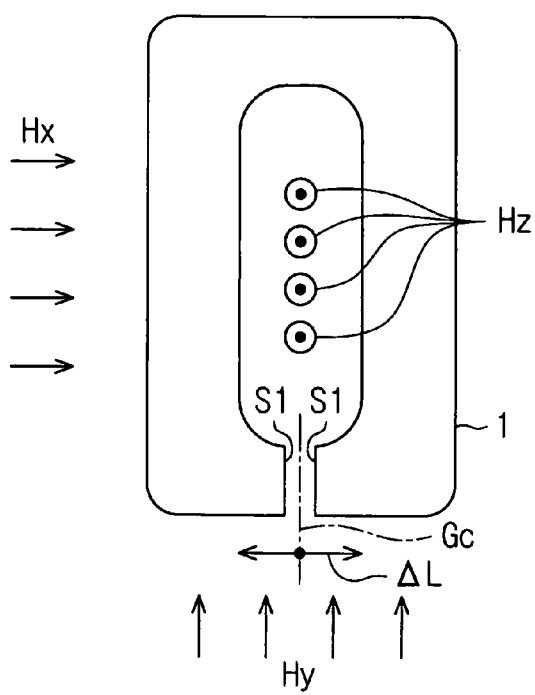
FIG. 4 is a schematic plan view showing a relation between the current sensing device and external magnetic field.

Further, as shown in FIG. 4, external magnetic fields in the directions X, Y, Z are denoted as Hx, Hy, Hz, respectively, and a deviation (distance) of the Hall element forming surface 12a from the center Gc of the gap 1a, that is, center between the end surfaces S1, S2, is denoted as ΔL. Influence of the external magnetic fields were measured based on the output voltage of the sensor chip 12 indicative of the magnetic field density B by changing the distance ΔL of the sensor chip 12 from the center Gc of the gap 1a for each external magnetic field Hx, Hy, Hz of the same fixed magnitude (1.0 mT), while not supplying any electric current in the conductive wire 2. In this measurement, the gap 1a (width is 2D) was 2.5 mm. The results of measurement are shown in FIG. 5.

Figure 5:
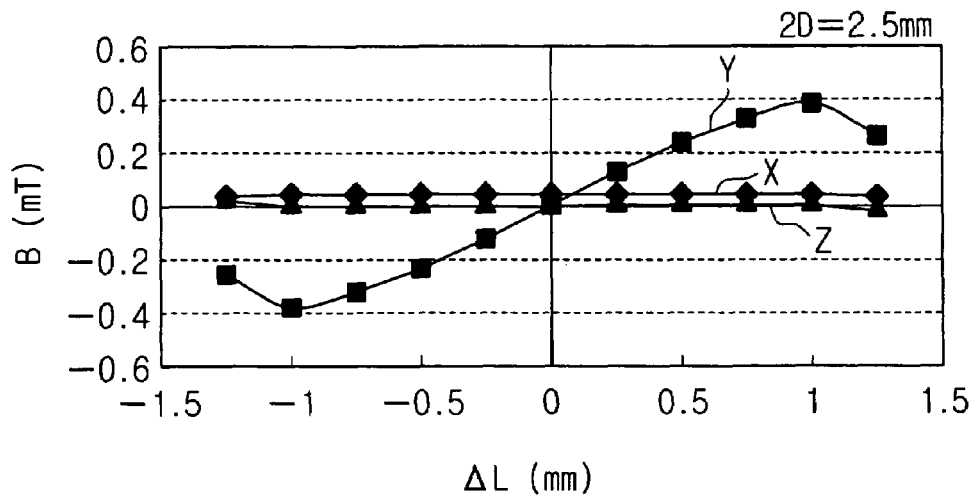
FIG. 5 is a graph showing magnitudes of the external magnetic fields (magnetic flux densities) relative to distance from a center of a gap in a magnetic core.

As understood from FIG. 5, the output voltages of the sensor chip 12 were nearly zero and varied very little relative to the external magnetic fields Hx and Hz, wherever the position of the sensor chip 12 is deviated from the center Gc of the gap 1a. On the other hand, the output voltage of the sensor chip 12 was much larger and varied greatly when the external magnetic field Hy was applied than when the external magnetic field Hx or Hz was applied. This output voltage of the sensor chip 12 was nearly zero when the sensor chip 12 was positioned substantially on the center Gc of the gap 1a, that is, when the deviation ΔL was nearly zero. With this measurement, it is confirmed that the influence of the external magnetic fields is made negligibly small by positioning the Hall element 14 in the center of the gap 1a. Thus, the influence of the external magnetic field and hence the output error of the sensor chip 12 is reduced to a minimum by positioning the sensor chip 12 at the same distance from the end surfaces S1 and S2 of the magnetic core 1.

Second Embodiment

Figure 6A:
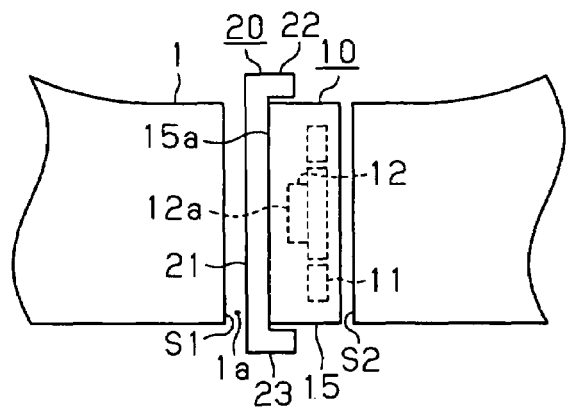
FIGS. 6A and 6B are a plan view and a side view of a current sensing device according to a second embodiment of the present invention.
Figure 6B:
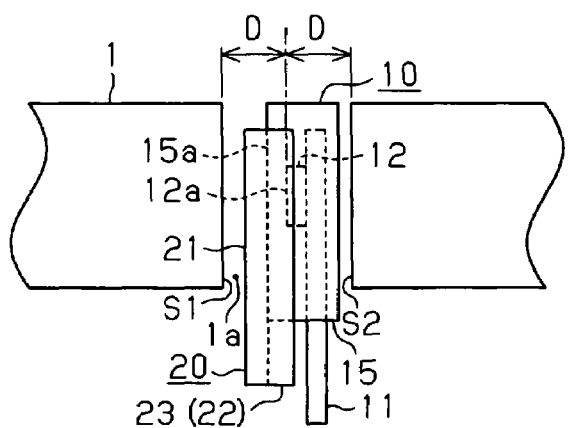

In a second embodiment, a positioning member 20 is used to regulate the position of the sensor package 10 as shown in FIGS. 6A and 6B. The positioning member 20 includes a rectangular plate part 21 and stopper parts 22, 23 extending from the plate part 21 in parallel in the same direction. The plate part 21 is positioned in parallel to the end surfaces S1, S2 of the magnetic core 1 and more closely to one end surface 1a than to the other end surface S2. The stopper parts 22, 23 are on opposing sides of the plate part 21 and extend in the direction Z, which is the thickness direction of the magnetic core 1. The resin mold 15 has a side surface 15a, which is parallel to the Hall element forming surface 12a. The sensor package 10 is fit between the stopper parts 22, 23 in such a manner that the side surface 15a of the resin mold 15 contacts the plate part 21. The positioning member 20 may be fixed to a base or the like (not shown) so that the Hall element forming surface 12a is automatically positioned on the center of the gap 1a when the sensor package 10 is fit in the space defined by the plate part 21 and the stopper parts 22, 23.

According to the second embodiment, in addition to reducing the influence of the external magnetic fields, the accuracy in positioning the sensor package 10 in the small gap 1a is enhanced. Specifically, since the plate part 21 is parallel to the end surfaces S1, S2 of the magnetic core 1, the Hall element 12 can be located easily at the same distance from the end surfaces S1, S2. Further, since the stopper parts 22, 23 restrict movement of the sensor package 10, the sensor package 10 can be assembled easily in the gap 1a.

Third Embodiment

Figure 7:
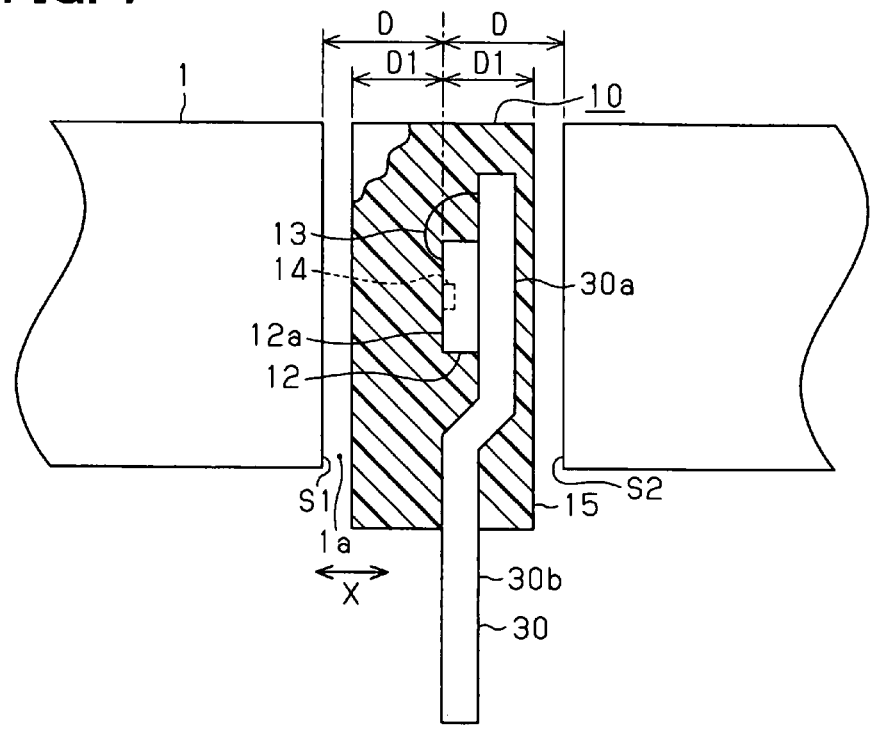
FIG. 7 is a sectional side view of a current sensing device according to a third embodiment of the present invention.

In a third embodiment, as shown in FIG. 7, a lead frame 30 is bent to have a first part 30a for mounting the sensor chip 12 and a second part 30b extending outward from the resin mold 15. The parts 30a and 30b are in parallel to each other while having a step in the direction X, and the second part 30b for connection with an external device is closer to the center of the resin mold 15 in the direction X than the first part 30a is. According to this arrangement, since the second part 30b is positioned near the center of the gap 1a when the sensor chip 14 is positioned in the center of the gap 1a, the sensor package 10 can be assembled in the gap 1a easily.

To sense the current If by the sensor chip 12 with higher accuracy, it is necessary to shorten or narrow the gap 1a between the end surfaces S1 and S2. The Hall element 14 is therefore positioned in the center of the resin mold 15, that is, the Hall element forming surface 12a is spaced the same distance D1 from the opposing surfaces of the resin mold 15. The Hall element 14 is nearly on the same plane as the part 30b of the lead frame 30. Since the thickness of the resin mold 15 are the same on both sides of the Hall element forming surface 12a, the Hall element 14 thus molded substantially equally receives less thermal influence after being installed in the gap 1a.

Fourth Embodiment

Figure 8:
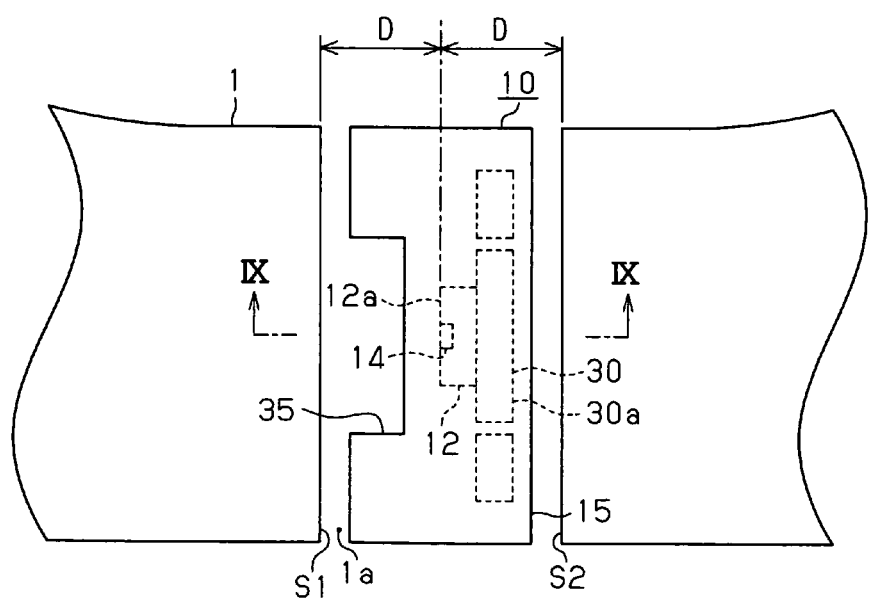
FIG. 8 is a plan view of a current sensing device according to a fourth embodiment of the present invention.
Figure 9:
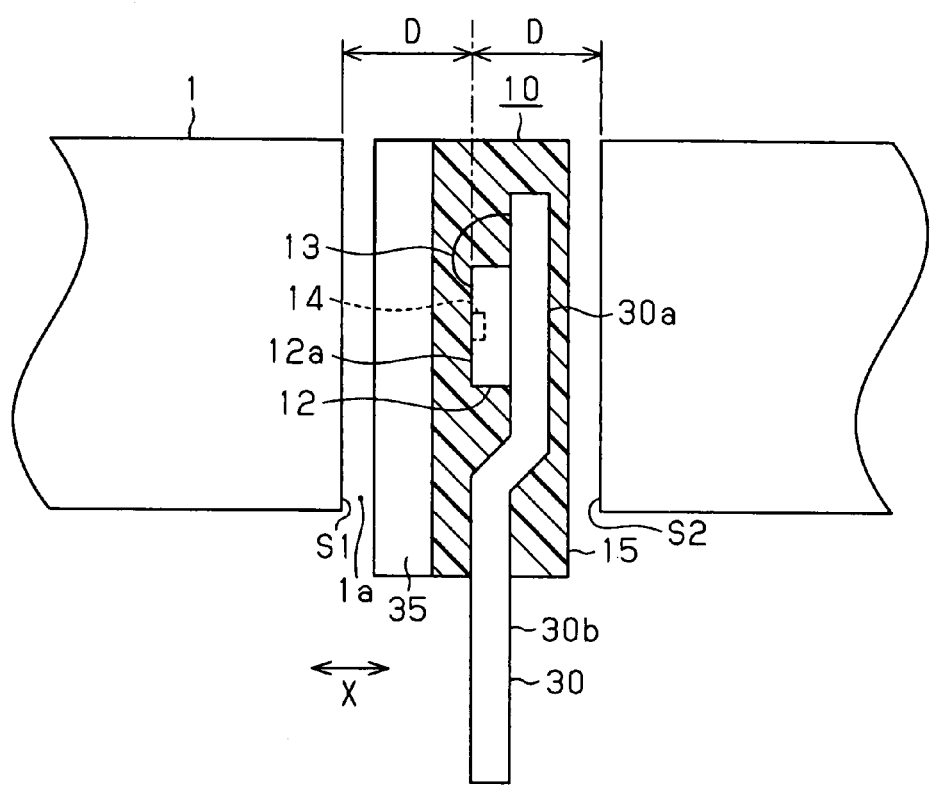
FIG. 9 is a sectional side view of the current sensing device taken along a line IX-IX in FIG. 8.
Figure 10A:
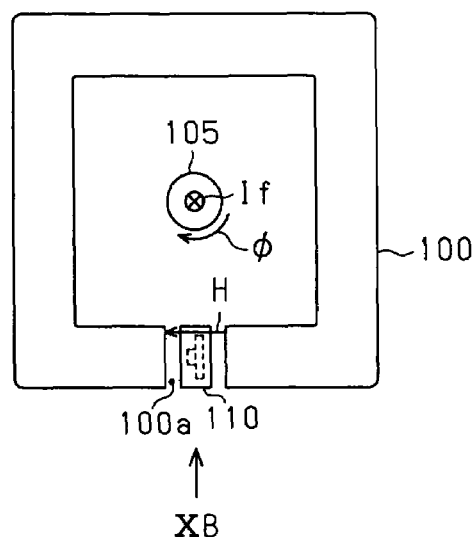
FIGS. 10A and 10B are a plan view and a side sectional view of a conventional current sensing device.
Figure 10B:
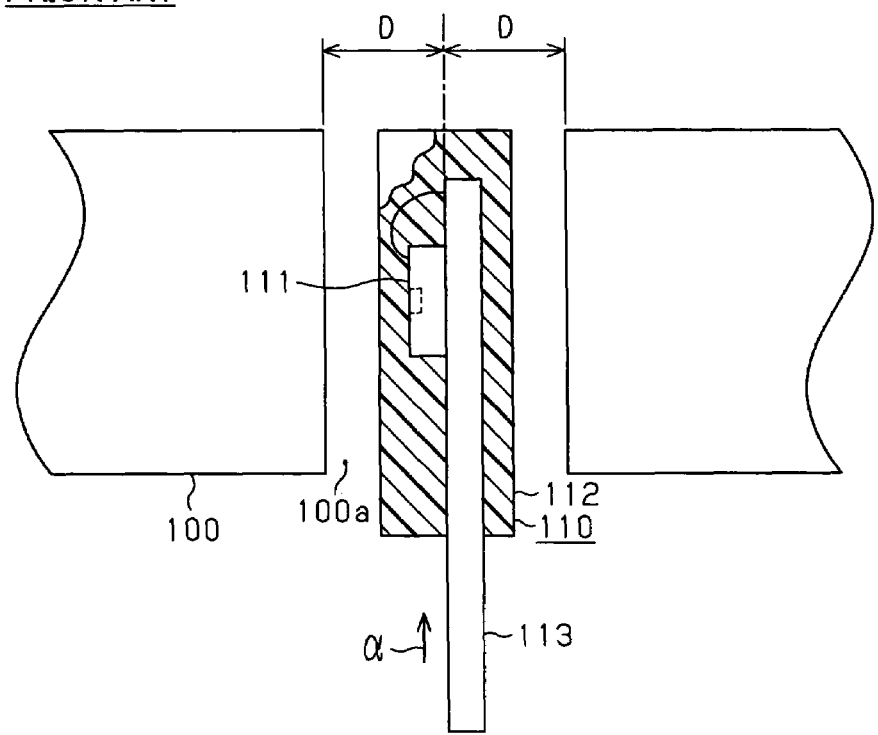

In a fourth embodiment, as shown in FIGS. 8 and 9, the resin mold 15 has a con-cavity or recess 35 on a side surface facing the end surface S1 of the magnetic core 1. That is, the recess 35 is formed on one half part of the sensor package 10 which is opposite to the other half part, in which the lead frame 30 and the sensor chip 12 are embedded. The recess 35 faces the sensor chip 12 and has a width wider than that of the sensor chip 12. Since the resin mold 15 is thinned near the sensor chip 12, the volume of molding resin can be reduced. This sensor package 10 can be assembled with a positioning member (not shown) in the similar manner as in the second embodiment shown in FIGS. 6A and 6B.

MODIFICATION

In each of the above embodiments, the sensor chip 12 may include only a Hall element without any other signal processing circuits. Further, the Hall element may be either a lateral-type or a vertical-type. In addition, a magneto-resistive element may be used as a magnetism sensing element in place of the Hall element.

What is claimed is:

1. A current sensing device for sensing a current flowing in a conductive wire, the current sensing device comprising:
    a magnetic core disposed to surround the conductive wire and having a gap between end surfaces thereof so that a magnetic field is generated in the gap in accordance with a current flowing in the conductive wire; and
    a sensor package including a magnetism sensing element and disposed in the gap to produce an output signal corresponding to the magnetic field in the gap, wherein
    the magnetism sensing element is disposed in a center of the gap. which is a same distance from the end surfaces of the magnetic core,
    the sensor package further includes a lead frame on which the sensing element is supported and a resin mold in which the magnetism sensing element and at least a part of the lead frame are molded with resin, and
    a positioning member is disposed in the gap and in contact with the resin mold.

2. The current sensing device as in claim 1, wherein the positioning member includes:
    a plate part which contacts the resin mold.

3. The current sensing device as in claim 2, wherein: the plate part is in parallel with the end surfaces of the magnetic core.

4. The current sensing device as in claim 2, wherein the positioning member further includes:
   a pair of stopper parts extending from both ends of the plate part and restricting the sensor package from moving.

5. The current sensing device for sensing a current flowing in a conductive wire, the current sensing device comprising:
   a magnetic core disposed to surround the conductive wire and having a gap between end surfaces thereof so that a magnetic field is generated in the gap in accordance with a current flowing in the conductive wire; and
   a sensor package including a magnetism sensing element and disposed in the gap to produce an output signal corresponding to the magnetic field in the gap, wherein
   the magnetism sensing element is disposed in a center of the gap, which is a same distance from the end surfaces of the magnetic core,
   the sensor package further includes a lead frame on which the sensing element is supported and a resin mold in which the magnetism sensing element and at least a part of the lead frame are molded with resin,
   the lead frame includes a mounting part on which the magnetism sensing element is mounted and an extending part which is exposed from the resin mold at a position which is closer to the center of the gap than the mounting part, and
   the magnetism sensing element is embedded in a center of the resin mold, which is a same distance from surfaces of the resin mold facing the end surfaces of the magnetic core.

6. The current sensing device as in claim 5, wherein: the lead frame is bent to form the mounting part and the extending part.

7. The current sensing device as in claim 5, wherein:
   the resin mold has a thinned part near the magnetism sensing element so that the magnetic sensing element is embedded in the thinned part of the resin mold.

8. The current sensing device as in claim 7, wherein:
   the resin mold has a recess which thins the resin mold and faces the magnetism sensing element.

* * * * *